(12) United States Patent
Sadaka et al.

(10) Patent No.: US 8,501,537 B2
(45) Date of Patent: Aug. 6, 2013

(54) METHODS FOR BONDING SEMICONDUCTOR STRUCTURES INVOLVING ANNEALING PROCESSES, AND BONDED SEMICONDUCTOR STRUCTURES FORMED USING SUCH METHODS

(75) Inventors: Mariam Sadaka, Austin, TX (US); Ionut Radu, Crolles (FR); Didier Landru, Champ Pres Froges (FR); Lea Di Cioccio, Saint Ismier (FR)

(73) Assignees: Soitec, Bernin (FR); Commissariat a l'Energie Atomique et aux Energies Alternatives, Paris (FR)

( * ) Notice: Subject to any disclaimer, the term of this patent is extended or adjusted under 35 U.S.C. 154(b) by 182 days.

(21) Appl. No.: 13/076,840

(22) Filed: Mar. 31, 2011

(65) Prior Publication Data

US 2012/0252162 A1    Oct. 4, 2012

(51) Int. Cl.
*H01L 21/00* (2006.01)
*H01L 21/30* (2006.01)
*H01L 21/46* (2006.01)

(52) U.S. Cl.
USPC .................. 438/107; 438/455; 257/E21.567

(58) Field of Classification Search
USPC ... 438/107–109, 118, 119, 455; 257/E21.567
See application file for complete search history.

(56) References Cited

U.S. PATENT DOCUMENTS

| 6,962,835 B2 | 11/2005 | Tong et al. |
| 2005/0003664 A1 | 1/2005 | Ramanathan et al. |
| 2007/0284409 A1 | 12/2007 | Kobrinsky et al. |
| 2008/0041517 A1 | 2/2008 | Moriceau |
| 2008/0213997 A1 | 9/2008 | Lee et al. |

FOREIGN PATENT DOCUMENTS

FR    2872625 A1    1/2006

OTHER PUBLICATIONS

French Preliminary Search Report and Written Opinion for French Application No. FR1153084 dated Jan. 24, 2012, 9 pages.
Chattopadhyay et al., In-Situ Formation of a Copper Silicide Cap for TDDB and Electromigration Improvement, IEEE 06CH37728, 44th Annual International Reliability Physics Symposium, San Jose, 2006, pp. 128-130.
Chen et al., Microstructure Evolution and Abnormal Grain Growth During Copper Wafer Bonding, Applied Physics Letters, vol. 81, No. 20, Nov. 11, 2002, pp. 3774-3776.

(Continued)

*Primary Examiner* — Charles Garber
*Assistant Examiner* — Calvin Choi
(74) *Attorney, Agent, or Firm* — TraskBritt

(57) ABSTRACT

Methods of bonding together semiconductor structures include annealing a first metal feature on a first semiconductor structure, bonding the first metal feature to a second metal feature of a second semiconductor structure to form a bonded metal structure that comprises the first metal feature and the second metal feature, and annealing the bonded metal structure. Annealing the first metal feature may comprise subjecting the first metal feature to a pre-bonding thermal budget, and annealing the bonded metal structure may comprise subjecting the bonded metal structure to a post-bonding thermal budget that is less than the pre-bonding thermal budget. Bonded semiconductor structures are fabricated using such methods.

18 Claims, 4 Drawing Sheets

OTHER PUBLICATIONS

Gambino et al., "Copper Interconnect Technology for the 32 nm Node and Beyond," IEEE (2009) Custom Integrated Circuits Conference (CICC), pp. 141 148.

Gambino et al., Yield and Reliability of Cu Capped with CoWP Using a Self-Activated Process, IEEE, Interconnect Technology Conference, 2006, ISBN: 1-4244-0104-6, pp. 30-32.

Yokogawa et al., Tradeoff Characteristics Between Resistivity and Reliability for Scaled-Down Cu-Based Interconnects, IEE Transaction on Electron Devices, vol. 55, No. 1, Jan. 2008, pp. 350-357.

Gan et al., Effect of passivation on stress relaxation in electroplated copper films, J. Mater. Res., vol. 21, No. 6, Jun 2006 © 2006 Materials Research Society.

Lambert et al., Study of CMOS-Compatible Copper Etching for Organic Coating, www.electrochem.org/meetings/scheduler/abstracts/216/2064.pdf, ECS Transactions 25, (2009), 1 page.

Lu et al., Failure by Simultaneous Grain Growth, Strain Localization, and Interface Debonding in Metal Films on Polymer Substrates, J. Mater. Res., vol. 24, No. 2, Feb. 2009, pp. 379-385.

METHODS FOR BONDING SEMICONDUCTOR STRUCTURES INVOLVING ANNEALING PROCESSES, AND BONDED SEMICONDUCTOR STRUCTURES FORMED USING SUCH METHODS

TECHNICAL FIELD

Embodiments of the present disclosure relate to methods of bonding together semiconductor structures, and to bonded semiconductor structures formed using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou, et al. "The Handbook of 3D Integration," Wiley-VCH (2008).

The 3D integration of semiconductor structures may take place by the attachment of a semiconductor die to one or more additional semiconductor dies (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermo-compression bonding" methods are bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve suitable bond strength at the bonding interface. Ultra-low temperature direct bonding methods in which pressure is applied between the bonding surfaces are often referred to in the art as "surface assisted bonding" or "SAB" methods. Thus, as used herein, the terms "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

Direct metal-to-metal bonds between active conductive features in semiconductor structures may, in some instances, be prone to mechanical failure or electrical failure after a period of time even though an acceptable direct metal-to-metal bond may be initially established between the conductive features of the semiconductor structures. Although not fully understood, it is believed that such failure may be at least partially caused by one or more of three related mechanisms. The three related mechanisms are strain localization, which may be promoted by large grains, deformation-associated grain growth, and mass transport at the bonding interface. Such mass transport at the bonding interface may be at least partially due to electromigration, phase segregation, etc.

Electromigration is the migration of metal atoms in a conductive material due to an electrical current. Various methods for improving the electromigration lifetime of interconnects have been discussed in the art. For example, methods for improving the electromagnetic lifetime of copper interconnects are discussed in J. Gambino et al., "Copper Interconnect Technology for the 32 nm Node and Beyond," IEEE 2009 Custom Integrated Circuits Conference (CICC), pages 141-148.

BRIEF SUMMARY

This summary is provided to introduce a selection of concepts in a simplified form, which concepts are further described in the detailed description below of some example embodiments of the disclosure. This summary is not intended to identify key features or essential features of the claimed subject matter, nor is it intended to be used to limit the scope of the claimed subject matter.

In some embodiments, the present disclosure includes methods of directly bonding a first semiconductor structure to a second semiconductor structure. In accordance with such methods, a metal is deposited over a first semiconductor structure. The metal deposited over the first semiconductor structure is subjected to a first thermal budget to anneal the metal deposited over the first semiconductor structure in a first annealing process. A portion of the metal deposited over the first semiconductor structure is removed after subjecting the metal to the first thermal budget. A remaining portion of the metal deposited over the first semiconductor structure is subjected to a second thermal budget to anneal the remaining portion of the metal deposited over the first semiconductor structure in a second annealing process. At least one metal feature of the first semiconductor structure comprising the remaining portion of the metal deposited over the first semiconductor structure is directly bonded to at least one metal feature of a second semiconductor structure to form a bonded metal structure comprising the at least one metal feature of the first semiconductor structure and the at least one metal feature of the second semiconductor structure. The bonded metal structure is subjected to a third thermal budget to anneal the bonded metal structure in a third annealing process, wherein the third thermal budget is less than the second thermal budget.

In additional embodiments, the present disclosure includes methods of bonding a first semiconductor structure to a second semiconductor structure. A first metal feature on a first semiconductor structure is annealed by subjecting the first metal feature to a total pre-bonding annealing thermal budget. The first metal feature is directly bonded to a second metal feature of a second semiconductor structure in an ultra-low temperature direct bonding process to form a bonded metal structure comprising the first metal feature and the second metal feature. The bonded metal structure is annealed by subjecting the bonded metal structure to a post-bonding thermal budget that is less than the total pre-bonding annealing thermal budget.

In yet further embodiments, the present disclosure includes methods of bonding a first semiconductor structure to a second semiconductor structure. A first metal feature on a first semiconductor structure is annealed by subjecting the first metal feature to a pre-bonding thermal budget and causing recrystallization of at least some grains within the first metal feature. The recrystallization of grains within the first metal feature may result in an alteration of an orientation of grains within the first metal feature. The first metal feature is directly bonded to a second metal feature of a second semiconductor structure in an ultra-low temperature direct bonding process to form a bonded metal structure comprising the first metal feature and the second metal feature. The bonded metal structure is annealed by subjecting the bonded metal structure to a post-bonding thermal budget that is less than the pre-bonding thermal budget.

Additional embodiments of the disclosure include bonded semiconductor structures fabricated in accordance with the methods described herein.

BRIEF DESCRIPTION OF THE DRAWINGS

Embodiments of the present disclosure may be understood more fully by reference to the following detailed description of example embodiments of the present disclosure, which are illustrated in the appended figures in which.

DETAILED DESCRIPTION

Figure 1:
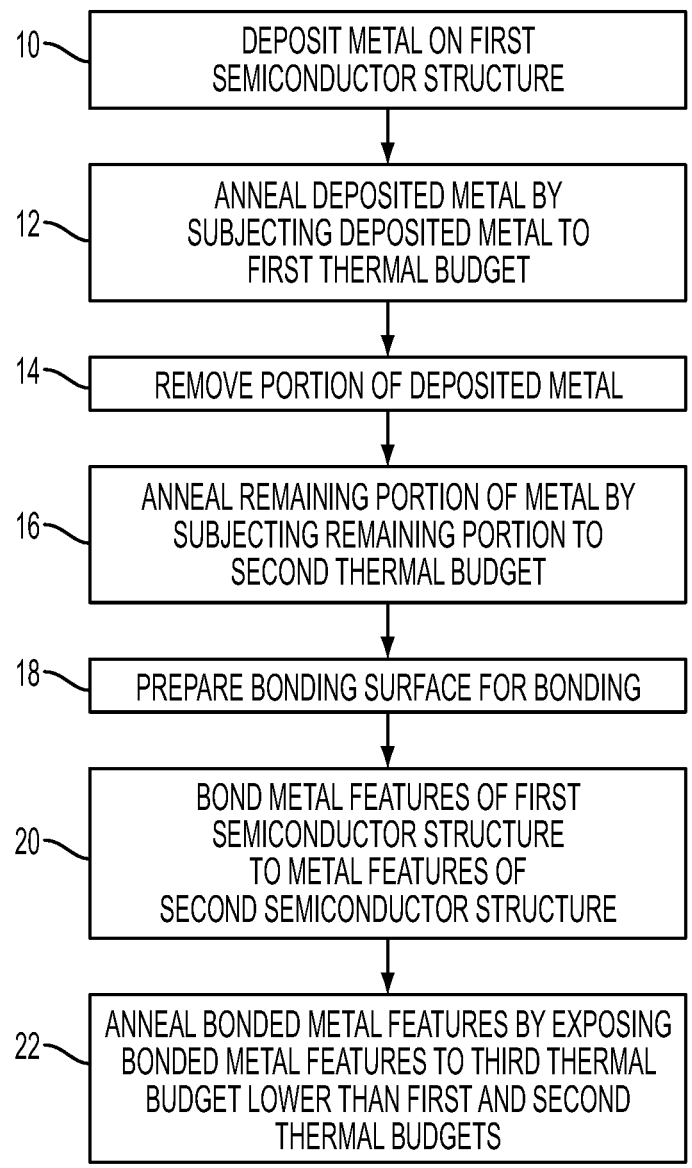
FIG. 1 is a flow chart illustrating example embodiments of methods of forming bonded semiconductor structures of the disclosure.

The illustrations presented herein are not meant to be actual views of any particular material, device, system, or method, but are merely idealized representations that are used to describe embodiments of the disclosure.

Any headings used herein should not be considered to limit the scope of embodiments of the disclosure as defined by the claims below and their legal equivalents. Concepts described in any specific heading are generally applicable in other sections throughout the entire specification.

As used herein, the term "semiconductor structure" means and includes any structure that is used in the formation of a semiconductor device. Semiconductor structures include, for example, dies and wafers (e.g., carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms, such as "through silicon vias," "through substrate vias," "through wafer vias," or abbreviations of such terms, such as "TSVs" or "TWVs." TWIs typically extend through a semiconductor structure in a direction generally perpendicular to the generally flat, major surfaces of the semiconductor structure (i.e., in a direction parallel to the "Z" axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "back surface," when used in relation to a processed semiconductor structure, means and includes an exposed major surface of the processed semiconductor structure on an opposing side of the processed semiconductor structure from an active surface of the semiconductor structure.

As used herein, the term "thermal budget," when used in relation to an annealing process, refers to the area under a line or curve graphing the temperature of the annealing process as a function of the time period over which the annealing process is conducted. In an annealing process conducted at a single temperature (i.e., an isothermal annealing process), the thermal budget of the annealing process is simply the product of the temperature at which the annealing process is conducted and the length of time over which the annealing process is conducted.

In some embodiments, the present disclosure comprises improved methods of directly bonding a first semiconductor structure to a second semiconductor structure to form a bonded semiconductor structure. In particular, embodiments of the disclosure may comprise methods of forming direct metal-to-metal bonds between metal features of a first semiconductor structure and metal features of a second semiconductor structure, such that the strength, stability, and/or operational lifetime of the direct metal-to-metal bonds are improved relative to previously known methods.

In some embodiments, the direct metal-to-metal bonding methods of the disclosure may comprise non thermo-compression bonding methods.

Process flow of embodiments of methods of the present disclosure is illustrated in FIG. 1, and associated structures that may be formed in accordance with such a process flow are illustrated in FIGS. 2A-2F. The methods involve the direct bonding of a first semiconductor structure to a second semiconductor structure.

Figure 2A:
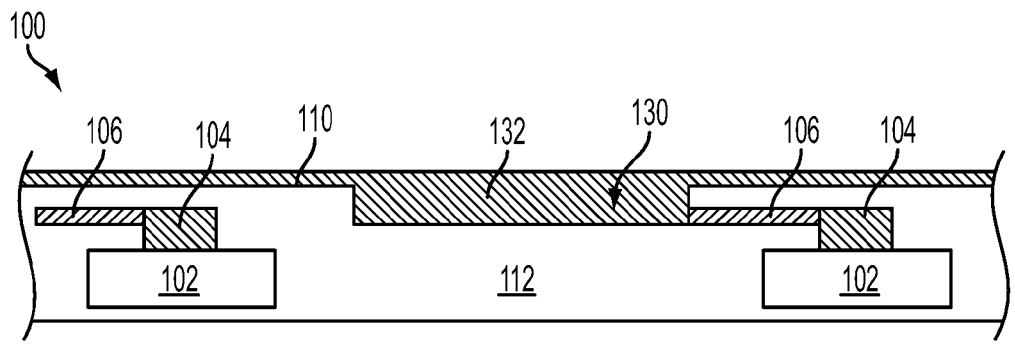
FIGS. 2A-2F depict the formation of a bonded semiconductor structure in accordance with an embodiment of a method as illustrated in FIG. 1.

Referring to FIG. 1, in action 10, metal may be deposited over a first semiconductor structure. As shown in FIG. 2A, a first semiconductor structure 100 may be formed. The first semiconductor structure 100 may comprise a processed semiconductor structure, and may include one or more active device features, such as one or more of a plurality of transistors 102 (which are schematically represented in the figures), a plurality of vertically extending conductive vias 104, and a plurality of horizontally extending conductive traces 106. The active device features may comprise electrically conductive materials and/or semiconductor materials that are surrounded by non-conductive dielectric material 112. By way of example and not limitation, one or more of the conductive vias 104 and the conductive traces 106 may comprise one or more conductive metals or metal alloys such as, for example, copper, aluminum, or an alloy or mixture thereof.

Figure 2B:
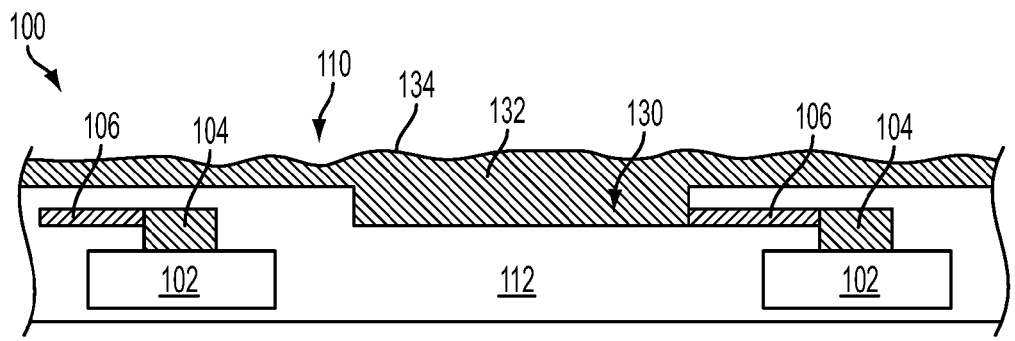
Figure 2C:
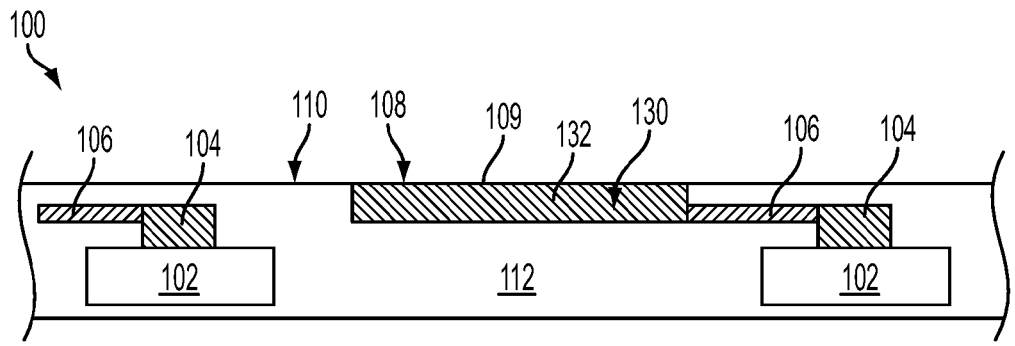

The first semiconductor structure 100 may also comprise a plurality of recesses 130 in which it is desired to form a plurality of bond pads 108 (FIG. 2C). To form the bond pads 108, metal 132 may be deposited over (e.g., onto) the active surface 110 of the first semiconductor structure 100, such that the metal 132 at least entirely fills the recesses 130 as shown in FIG. 2A. Excess metal 132 may be deposited onto the semiconductor structure 100 such that the recesses 130 are entirely filled with the metal 132, and such that additional metal 132 is disposed over (e.g., covers) the active surface 110 of the first semiconductor structure 100. By way of example and not limitation, the metal 132 may comprise a metal or metal alloy such as copper, aluminum, nickel, tungsten, titanium or an alloy or mixture thereof. In some embodiments, the metal 132 may be selected to comprise copper or a copper alloy.

The metal 132 may be deposited onto the first semiconductor structure 100 using, for example, one or more of an electroless plating process, an electrolytic plating process, a sputtering process, a chemical vapor deposition (CVD) process, a physical vapor deposition (PVD) process, and an atomic layer deposition (ALD) process. As a non-limiting example, a seed layer of copper may be deposited using a CVD process, after which additional copper may be deposited onto the seed layer of copper at a relatively faster rate using an electroless plating process.

Referring again to FIG. 1, in action 12, the metal 132 deposited onto the first semiconductor structure 100 (FIG. 2A) may be annealed by subjecting the deposited metal to a first thermal budget. In other words, the metal 132 deposited over the first semiconductor structure 100 may be subjected to a first thermal budget to anneal the metal 132 deposited over the first semiconductor structure 100. By way of example and not limitation, the deposited metal 132 may be annealed by subjecting the metal 132 to an annealing temperature or temperatures below about 400° C. for an annealing time period of about two hours or less (e.g., between about thirty minutes (30 min.) and about one hour (1 hr.)).

It has been observed that copper films deposited by plating processes such as those mentioned above may undergo microstructural changes after deposition. Such microstructural changes may include recrystallization and/or grain growth. The recrystallization process can lead to changes in the spatial orientation of the grains. Such microstructural changes may lead to changes in electrical properties (e.g., electrical resistance) and/or physical properties (hardness) of the deposited copper films. The rate at which such microstructural changes occur may be temperature dependent, and may increase as the temperature of the copper films is increased.

As the parameters of subsequent processes to which the metal 132 is subjected, as well as the electrical performance and structural integrity of device structures ultimately formed from the metal 132, may be at least partially dependent upon the electrical properties and/or the physical properties of the metal 132, the metal 132 deposited onto the first semiconductor structure 100 in action 10 may be annealed in action 12 (FIG. 1) to induce and/or promote microstructural changes in the deposited metal 132 that might otherwise occur in the deposited metal 132 given sufficient time at room temperature, or upon exposure of the deposited metal 132 to elevated temperatures in subsequent processing. Through the annealing process of action 12, the microstructural changes in the deposited metal 132 may be induced to stabilize the microstructure of the deposited metal 132 (and, hence, the electrical properties and/or the physical properties of the deposited metal 132) prior to subjecting the first semiconductor structure 100 to subsequent processing, as discussed below.

Thus, in some embodiments, the annealing process of action 12 may comprise causing recrystallization of at least some grains within the metal 132. The recrystallization of the grains within the metal 132 may result in an alteration of an orientation of grains within the metal 132.

Further, the recrystallization of grains within the metal 132 may further result in a change in at least one of an electrical property of the metal 132 and a physical property of the metal 132. For example, the annealing process of action 12 may result in a decrease in the electrical resistance of the metal 132 in at least one direction, such as the vertical direction from the perspective of FIG. 2B, which is transverse to the active surface 110 of the first semiconductor structure 100. As another example, the annealing process of action 12 may result in a decrease in the hardness of the metal 132.

As shown in FIG. 2B, subjecting the deposited metal 132 to the first thermal budget to anneal the metal 132 and induce microstructural changes therein may result in volumetric expansion (either locally, by, for example, grain reorientation and/or grain growth, or in bulk, by, for example, phase changes) of the deposited metal 132 and changes in the topography of the exposed surface 134 of the deposited metal 132.

The annealing process of action 12, in some embodiments, may be carried out in situ in a chamber or other enclosure in which the deposition process of action 10 is also conducted. In such embodiments, the annealing process of action 12 may be carried out in the chamber or other enclosure after the deposition process, but prior to removing the first semiconductor structure 100 from the chamber or other enclosure.

Referring again to FIG. 1, in action 14, a portion of the deposited and annealed metal 132 (FIG. 2B) may be removed from the first semiconductor structure 100 to form bond pads 108 that comprise remaining portions of the deposited and annealed metal 132 disposed in the recesses 130, as shown in FIG. 2C. The portion of the deposited and annealed metal 132 may be removed in accordance with action 14 (FIG. 1) using, for example, an etching process (e.g., a wet chemical etching process, a dry reactive ion etching process, etc.), a polishing or grinding process, or combination thereof, such as a chemical-mechanical polishing (CMP) process. For example, the active surface 110 of the first semiconductor structure 100 may be subjected to a CMP process to remove portions of the deposited and annealed metal 132 (FIG. 2B) overlying areas of the dielectric material 112 outside the recesses 130, such that only regions of the deposited and annealed metal 132 within the recesses 130 remain (which regions define and comprise the bond pads 108), and such that the dielectric material 112 is exposed at the active surface 110 in the areas laterally adjacent the regions of the deposited and annealed metal 132 within the recesses 130. Thus, one or more of the bond pads 108 may be exposed at the active surface 110 of the first semiconductor structure 100.

As shown in FIG. 1, after removing a portion of the deposited and annealed metal 132 in accordance with action 14, the first semiconductor structure 100 may be subjected to a second annealing process in action 16 in which the first semiconductor structure 100 is subjected to a second thermal budget. Subjecting the remaining portions of the deposited and annealed metal 132 disposed in the recesses 130 to a second thermal budget may induce further microstructural changes therein, and may be used to further stabilize the microstructure of the remaining portions of the deposited and annealed metal 132. The second annealing process of action 16 also may improve the planarity of the exposed surfaces of the remaining portions of the deposited and annealed metal 132, and may relieve stresses within the remaining portions of the deposited and annealed metal 132. Such stresses in the remaining portions of the deposited and annealed metal 132, as well as non-planar topographies in the exposed surfaces of the remaining portions of the deposited and annealed metal 132 may be caused by a CMP process of action 14.

By way of example and not limitation, the remaining portions of the deposited and annealed metal 132 may be annealed in action 16 by subjecting the remaining portions of the deposited and annealed metal 132 to an annealing temperature or temperatures below about 400° C. for an annealing time period of about two hours or less (e.g., between about thirty minutes (30 minutes) and about one hour (1 hour)).

In some embodiments, the second thermal budget of action 16 may be greater than the first thermal budget of action 12. As the thermal budget is a function of both the annealing time period and the annealing temperature, the manner in which the second thermal budget of the annealing process of action 16 is rendered greater than the first thermal budget of the annealing process of action 12 may include varying the annealing temperatures, varying the annealing time periods, or varying both the annealing temperatures and the annealing time periods between the annealing process of action 12 and the annealing process of action 16.

In some embodiments, the annealing process of action 16 may be performed selectively across the active surface 110 of the first semiconductor structure 100 to compensate for any dishing of the bond pads 108 caused by the removal process of action 14, as discussed above. In such embodiments, the annealing process of action 16 may comprise a single wafer process such as a laser annealing process, in which a laser may be used to selectively anneal the bond pads 108 that have a concave bonding surface 109 (commonly referred to as the "dishing effect"). An additional example of selective annealing process of action 16 may utilize a hotplate or a heatable wafer chuck which comprises heating elements that can be individually and separately controlled.

Referring to FIG. 1, in action 18, the bonding surfaces 109 of the bond pads 108 may be prepared for bonding. Action 18 may comprise, for example, a touch-up CMP process, a chemical treatment process, and/or a cleaning process. By way of example and not limitation, the bonding surfaces 109 of the bond pads 108 may be cleaned by first soaking the first semiconductor structure 100 in deionized water. In addition, ammonium hydroxide ($NH_4OH$) may be utilized as a post-CMP cleaning method. To prevent excessive copper roughening, the ammonium hydroxide ($NH_4OH$) clean may be utilized in combination with a copper corrosion inhibitor such as, for example, benzotriazole (BTA) or under a form that does not contain dissolved ammonia ($NH_3$) gas such as, for example, tetramethyl-ammonium hydroxide (TMAH).

Figure 2D:
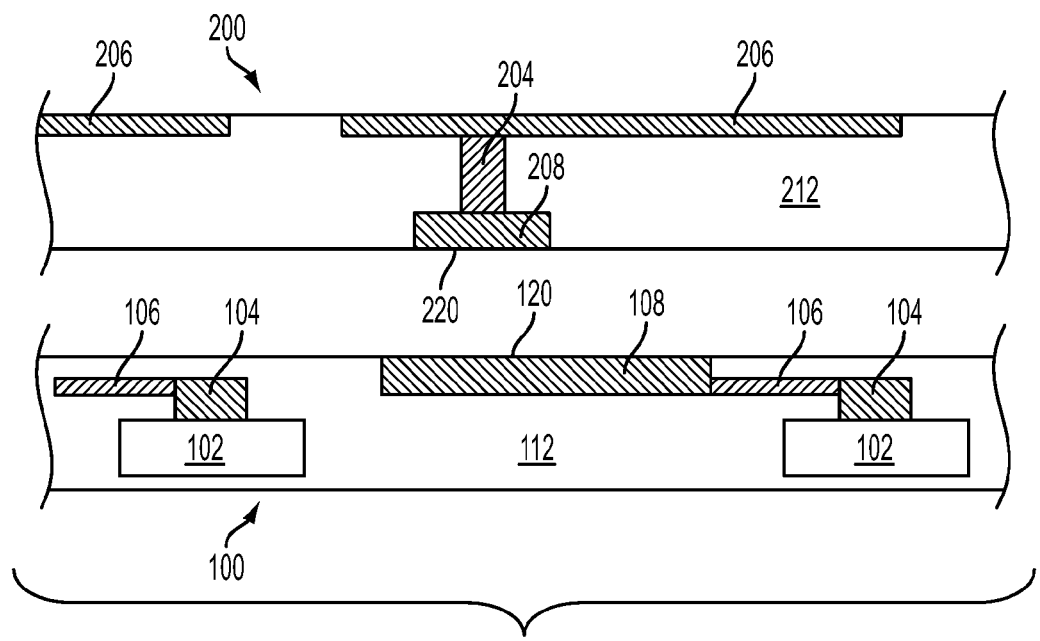

Referring again to FIG. 1, in action 20, the bond pads 108 may be directly bonded to metal features of a second semiconductor structure. Referring to FIG. 2D, the first semiconductor structure 100 may be aligned with a second semiconductor structure 200 such that the bond pads 108 of the first semiconductor structure 100 are aligned with conductive metallic bond pads 208 of the second semiconductor structure 200. As shown in FIG. 2D, the second semiconductor structure 200 also may comprise a processed semiconductor structure, and may include additional active device structures, such as, for example, vertically extending conductive vias 204 and laterally extending conductive traces 206. Although not shown in the figures, the second semiconductor structure 200 also may comprise transistors.

Exposed surfaces of the bond pads 108 may define one or more bonding surfaces 120 of the bond pads 108, and exterior exposed surfaces of the bond pads 208 may define bonding surfaces 220 of the bond pads 208 of the second semiconductor structure 200.

Figure 2E:
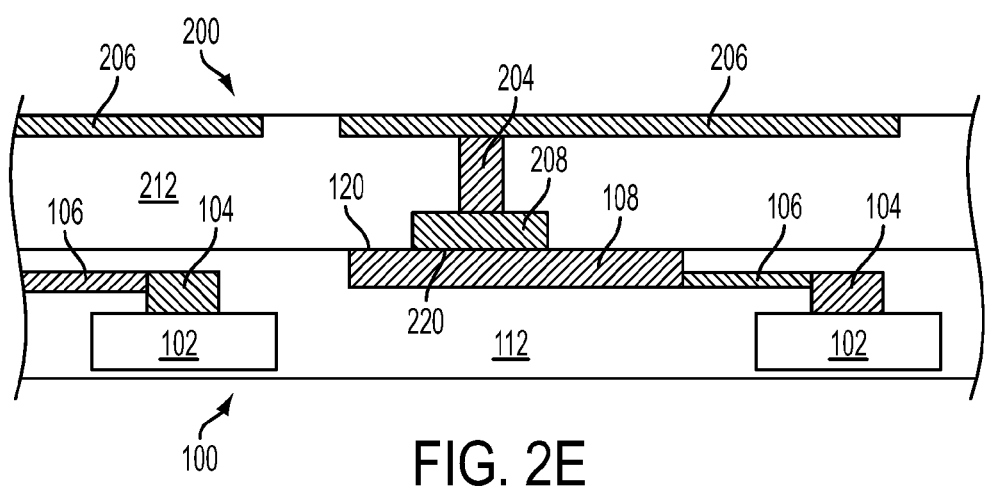

Referring to FIG. 2E, after aligning the first semiconductor structure 100 with a second semiconductor structure 200 such that the bond pads 108 of the first semiconductor structure 100 are aligned with the conductive metallic bond pads 208 of the second semiconductor structure 200, the first semiconductor structure 100 may be abutted against the second semiconductor structure 200 such that the bonding surfaces 120 of the bond pads 108 of the first semiconductor structure 100 are abutted directly against the bonding surfaces 220 of the bond pads 208 of the second semiconductor structure 200 without any intermediate bonding material (e.g., adhesive) therebetween.

Figure 2F:
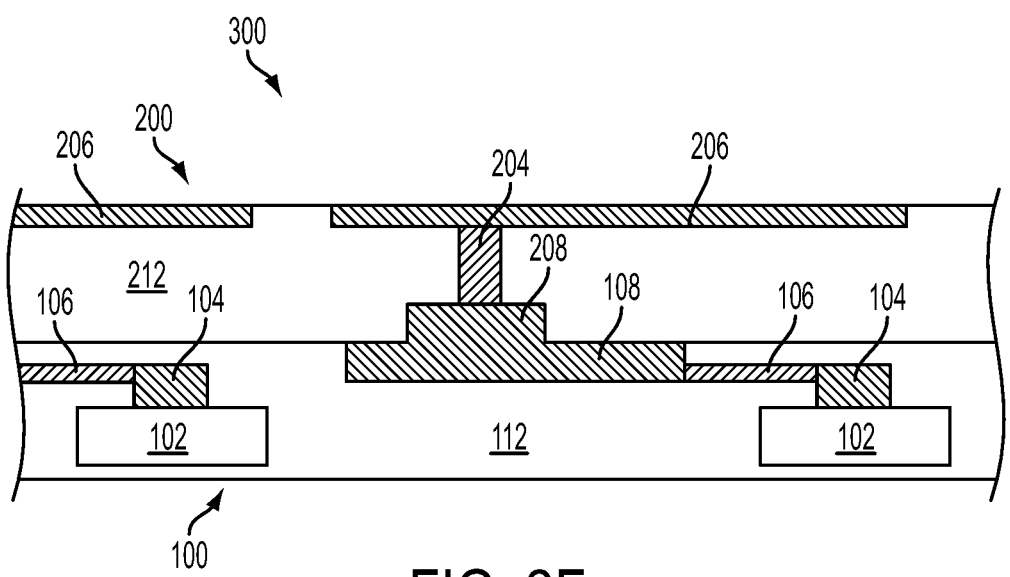

Referring to FIG. 2F, the bonding surfaces 120 of the bond pads 108 of the first semiconductor structure 100 then may be directly bonded to the bonding surfaces 220 of the bond pads 208 of the second semiconductor structure 200 to form a bonded semiconductor structure 300. The bonding process results in the formation of bonded metal structures that include the bond pads 108 and the bond pads 208 that have been bonded together. The bonding surfaces 220 of the bond pads 208 of the second semiconductor structure 200 may be directly bonded to the bonding surfaces 120 of the bond pads 108 of the first semiconductor structure 100 in a direct metal-to-metal (e.g., copper-to-copper) non thermo-compression bonding process, which, in some embodiments, may comprise an ultra-low temperature direct bonding process carried out in an environment at about room temperature (i.e., without any applied heat additional to that provided by the ambient environment).

Prior to bonding the first semiconductor structure 100 to the second semiconductor structure 200, the first semiconductor structure 100 and the second semiconductor structure 200 may be processed to remove surface impurities and undesirable surface compounds in action 18, and may be planarized in action 14 to increase the area of intimate contact at the atomic scale between the bonding surfaces 120 of the bond pads 108 and the bonding surfaces 220 of the bond pads 208. The area of intimate contact between the bonding surfaces 120 and the bonding surfaces 220 may be accomplished by polishing the bonding surfaces 120 and the bonding surfaces 220 to reduce the surface roughness thereof up to values close to the atomic scale, by applying pressure between the bonding surfaces 120 and the bonding surfaces 220 resulting in plastic deformation, or by both polishing the bonding surfaces 120, 220 and applying pressure between the first semiconductor structure 100 and the second semiconductor structure 200 to attain such plastic deformation.

In some embodiments, the first semiconductor structure 100 may be directly bonded to the second semiconductor structure 200 without applying pressure between the bonding surfaces 120, 220 at the bonding interface therebetween, although pressure may be applied between the bonding surfaces 120, 220 at the bonding interface in some ultra-low temperature direct bonding methods in order to achieve a suitable bond strength at the bonding interface. In other words, the direct bonding methods used to bond the bond pads 108 of the first semiconductor structure 100 to the bond pads 208 of the second semiconductor structure 200 may comprise surface assisted bonding (SAB) bonding methods in some embodiments of the disclosure.

In some embodiments, the bond pads 108 and the bond pads 208 may differ in at least one of size and shape. More particularly, the bond pads 108 may have a first cross-sectional area in a plane parallel to the bonded interface between the bond pads 108 and the bond pads 208, and the bond pads 208 may have a second cross-sectional area in a plane parallel to the bonded interface between the bond pads 108 and the bond pads 208 that differs from the first cross-sectional area of the bond pads 108. In such embodiments, the bonding surfaces 120 of the bond pads 108 may have a first size, and the bonding surfaces 220 of the bond pads 208 may have a second size that is different from the first size. The bond pads 108 may have a first cross-sectional shape in a plane parallel to the bonded interface between the bond pads 108 and the bond pads 208, and the bond pads 208 may have a second cross-sectional shape in a plane parallel to the bonded interface between the bond pads 108 and the bond pads 208 that differs from the first cross-sectional shape of the bond pads 108. In such embodiments, the bonding surfaces 120 of the bond pads 108 may have a first shape, and the bonding surfaces 220 of the bond pads 208 may have a second shape that is different from the first shape. In embodiments in which the bonding surfaces 120 of the bond pads 108 and the bonding surfaces 220 of the bond pads 208 differ in shape, they may have the same or different sizes (i.e., the same or different areas).

In additional embodiments, the bonding surfaces 120 of the bond pads 108 and the bonding surfaces 220 of the bond pads 208 may have at least substantially the same size and shape. In such embodiments, the bond pads 108 and the bond pads 208 can, in some situations, be intentionally or unintentionally laterally misaligned with one another.

In embodiments wherein the bond pads are of different size and/or are misaligned, attention should be given to the copper/oxide surfaces. The copper/oxide surfaces should be bonded prior to the post bonding anneal. In addition, the oxide may be covered or capped with a material, such as a dielectric material, to ensure proper passivation of the oxide surfaces, which may suppress the thermo-mechanical behavior of the copper. This may be especially a concern for low dielectric constant (low-K) oxides. A non-limiting example of a method that may be used to reduce copper thermo-mechanical behavior is to ensure the copper is bonded to a dielectric surface, such as a surface of a silicon nitride ($Si_xN_y$) material, in the area of non-overlap with an addition copper pad (i.e., pad misalignment). In such embodiments the abutting copper and silicon nitride surfaces may be bonded before annealing in order for the silicon nitride passivation to suppress thermo-mechanical behavior. For additional information, see for example "Effect of passivation on stress relaxation in electroplated copper films" Dongwen Gan and Paul S. Ho, Yaoyu Pang and Rui Huanga, Jihperng Leu, Jose Maiz, and Tracey Scherban, *J. Mater. Res.*, Vol. 21, No. 6, June 2006© 2006 Materials Research Society.

Referring again to FIG. 1, in action 22, the bonded metal structures comprising the bond pads 108 and bond pads 208 may be annealed by exposing the semiconductor structure 100 (and, hence, the bonded metal structures) to a third thermal budget that is less than or equal to the second thermal budget of action 16. In other words, the bonded metal structures may be subjected to a third thermal budget that is less than or equal to the second thermal budget of action 16 to anneal the bonded metal structures. By way of example and not limitation, the bonded metal structures may be annealed in action 22 by subjecting the bond pads 108 and the bond pads 208 to an annealing temperature or temperatures below about 400° C. for an annealing time period of about two hours or less (e.g., between about thirty minutes (30 min.) and about one hour (1 hr.)).

The annealing process of action 22 may, in some embodiments, be carried out in situ in a chamber or other enclosure in which the bonding process of action 20 is also conducted. In such embodiments, the annealing process of action 22 may comprise a later segment or portion of a continuous thermal cycle to which the semiconductor structure 100 is subjected in the chamber or other enclosure.

As previously mentioned herein, the third thermal budget of the annealing process of action 22 is less than or equal to the second thermal budget of the annealing process of action 16. The third thermal budget of the annealing process of action 22 also may be less than or equal to the first thermal budget of the annealing process of action 12.

Further, in some embodiments, the third thermal budget of the annealing process of action 22 may be less than or equal to the combined thermal budgets of the first thermal budget of the annealing process of action 12 and the second thermal budget of the annealing process of action 16. Stated another way, a metal feature, such as a bond pad 108, of the first semiconductor structure 100 may be annealed in one or more annealing processes by subjecting the metal feature to a total pre-bonding annealing thermal budget. The metal feature of the first semiconductor structure 100 then may be directly bonded to a second metal feature of a second semiconductor structure 200 as previously described. After the direct bonding process, the resulting bonded metal structure comprising the metal feature of the first semiconductor structure 100 and the metal feature of the second semiconductor structure 200 may be annealed by subjecting the bonded metal structure to a post-bonding thermal budget that is less than the total pre-bonding annealing thermal budget.

As the thermal budge is a function of both the annealing time period and the average annealing temperature, the manner in which the third thermal budget of the annealing process of action 22 is rendered less than or equal to the second thermal budget of the annealing process of action 16 and/or the first thermal budget of the annealing process of action 12 may include varying the average annealing temperatures, varying the annealing time periods, or varying both the average annealing temperatures and the annealing time periods between the annealing processes of action 12 and action 16 and the annealing process of action 22.

Thus, to selectively tailor the thermal budgets of the annealing processes of actions 12, 16, and 22, one or more of the following may be performed: (1) the average annealing temperature of the annealing process of action 16 may be selected to be equal to or higher than the average annealing temperature of the annealing process of action 22; (2) the average annealing temperature of the annealing process of action 12 may be selected to be equal to or higher than the average annealing temperature the average annealing temperature of the annealing process of action 22; (3) the annealing time period of the annealing process of action 12 may be selected to be equal to or longer than the annealing time period of the annealing process of action 22; (4) the annealing time period of the annealing process of action 16 may be selected to be equal to or longer than the annealing time period of the annealing process of action 22; and/or (5) the combined annealing time periods of the annealing processes of actions 12 and 16 may be selected to be equal to or longer than the annealing time period of the annealing process of action 22.

In some embodiments, each of the average annealing temperatures of the annealing processes of actions 12, 16, and 22 may be individually selected to be about four hundred degrees Celsius (400° C.) or less. Further, in some embodiments, each of the annealing time periods of the annealing processes of actions 12, 16, and 22 may be individually selected to be about two hours (2 hr.) or less.

In additional embodiments, one or more active features of the second semiconductor structure 200, such as the bond pads 208, may be formed in accordance with methods as described herein in relation to the formation of the bond pads 108 with reference to FIGS. 1 and 2A through 2F.

Although embodiments of the disclosure are described above with reference to the direct bonding of bond pads of a first semiconductor structure to bond pads of a second semiconductor structure, it is contemplated that metallic features other than bond pads of the first and second semiconductor structures may be processed and directly bonded as described herein. For example, such other metallic features may comprise conductive vias, through-wafer interconnects, conductive traces, or any other metallic feature exposed at a surface semiconductor structure. Additionally, it is contemplated that the conductive features of the second semiconductor structure, such as one or more of the bond pads 208, the conductive vias 204, and the conductive traces 206, may be formed and processed (e.g., annealed) as described herein in relation to the bond pads 108 of the first semiconductor structures 100 in addition to, or as an alternative to, processing of the conductive features of the first semiconductor structure 100, prior to directly bonding together the one or more conductive features of the first semiconductor structure and the one or more conductive features of the second semiconductor structure.

Additional non-limiting example embodiments of the disclosure are described below:

Embodiment 1

A method of directly bonding a first semiconductor structure to a second semiconductor structure, comprising: depositing metal over a first semiconductor structure; subjecting the metal deposited over the first semiconductor structure to a first thermal budget and annealing the metal deposited over the first semiconductor structure in a first annealing process; removing a portion of the metal deposited over the first semiconductor structure after subjecting the metal to the first thermal budget; subjecting a remaining portion of the metal deposited over the first semiconductor structure to a second thermal budget and annealing the remaining portion of the metal deposited over the first semiconductor structure in a second annealing process; directly bonding at least one metal feature of the first semiconductor structure comprising the remaining portion of the metal deposited over the first semiconductor structure to at least one metal feature of a second semiconductor structure to form a bonded metal structure comprising the at least one metal feature of the first semiconductor structure and the at least one metal feature of the second semiconductor structure; and subjecting the bonded metal structure to a third thermal budget and annealing the bonded metal structure in a third annealing process, the third thermal budget being less than the second thermal budget.

Embodiment 2

The method of Embodiment 1, wherein: subjecting the metal deposited over the first semiconductor structure to the first thermal budget comprises subjecting the metal deposited over the first semiconductor structure to a first average annealing temperature over a first annealing time period; subjecting the remaining portion of the metal deposited over the first semiconductor structure to the second thermal budget comprises subjecting the remaining portion of the metal to a second average annealing temperature over a second annealing time period; and subjecting the bonded metal structure to the third thermal budget comprises subjecting the bonded metal structure to a third average annealing temperature over a third annealing time period.

Embodiment 3

The method of Embodiment 2, further comprising selecting the second average annealing temperature to be higher than the third average annealing temperature.

Embodiment 4

The method of Embodiment 2 or Embodiment 3, further comprising selecting the first average annealing temperature to be higher than the third average annealing temperature.

Embodiment 5

The method of any one of Embodiments 2 through 4, further comprising selecting the second annealing time period to be longer than the third annealing time period.

Embodiment 6

The method of any one of Embodiments 2 through 5, further comprising selecting the first annealing time period to be longer than the third annealing time period.

Embodiment 7

The method of any one of Embodiments 2 through 6, further comprising individually selecting each of the first average annealing temperature, the second average annealing temperature, and the third average annealing temperature to be about four hundred degrees Celsius (400° C.) or less.

Embodiment 8

The method of any one of Embodiments 2 through 7, further comprising individually selecting each of the first annealing time period, the second annealing time period, and the third annealing time period to be about two hours (2 hr.) or less.

Embodiment 9

The method of any one of Embodiments 1 through 8, wherein depositing metal over the first semiconductor structure comprises depositing metal over the first semiconductor structure using an electroless plating process.

Embodiment 10

The method of any one of Embodiments 1 through 9, wherein depositing metal over the first semiconductor structure comprises depositing metal over the first semiconductor structure using a chemical vapor deposition process.

Embodiment 11

The method of Embodiment 10, wherein depositing metal over the first semiconductor structure comprises depositing a seed layer using a chemical vapor deposition process, and depositing additional material on the seed layer using an electroless plating process.

Embodiment 12

The method of any one of Embodiments 1 through 11, wherein depositing metal over the first semiconductor structure comprises depositing metal over the first semiconductor structure in a deposition chamber, and wherein subjecting the metal deposited over the first semiconductor structure to the first thermal budget and annealing the metal deposited over the first semiconductor structure in the first annealing process comprises annealing the metal deposited over the first semiconductor structure in situ within the deposition chamber.

Embodiment 13

The method of any one of Embodiments 1 through 12, wherein removing a portion of the metal deposited over the first semiconductor structure comprises subjecting the first semiconductor structure to a chemical-mechanical polishing process.

Embodiment 14

The method of any one of Embodiments 1 through 13, further comprising selecting the metal deposited over the first semiconductor structure to comprise copper or a copper alloy.

Embodiment 15

The method of any one of Embodiments 1 through 14, further comprising: forming a bonding surface of the at least one metal feature of the first semiconductor structure to have a first size; and forming a bonding surface of the at least one metal feature of the second semiconductor structure to have a second size different from the first size of the bonding surface of the at least one metal feature of the first semiconductor structure.

Embodiment 16

The method of any one of Embodiments 1 through 15, further comprising: forming a bonding surface of the at least one metal feature of the first semiconductor structure to have a first shape; and forming a bonding surface of the at least one metal feature of the second semiconductor structure to have a second shape different from the first shape of the bonding surface of the at least one metal feature of the first semiconductor structure.

Embodiment 17

The method of any one of Embodiments 1 through 16, wherein directly bonding the at least one metal feature of the first semiconductor structure to the at least one metal feature of the second semiconductor structure comprises an ultra-low temperature direct bonding process.

Embodiment 18

The method of any one of Embodiments 1 through 17, wherein directly bonding the at least one metal feature of the first semiconductor structure to the at least one metal feature of the second semiconductor structure comprises a surface assisted bonding process.

Embodiment 19

The method of any one of Embodiments 1 through 18, wherein directly bonding the at least one metal feature of the first semiconductor structure to the at least one metal feature of the second semiconductor structure comprises abutting a first bonding surface of the at least one metal feature of the first semiconductor structure directly against a second bonding surface of the at least one metal feature of the second semiconductor structure in an environment at about room temperature.

Embodiment 20

A method of bonding a first semiconductor structure to a second semiconductor structure, comprising: annealing a first metal feature on a first semiconductor structure by subjecting the first metal feature to a total pre-bonding annealing thermal budget; directly bonding the first metal feature to a second metal feature of a second semiconductor structure in an ultra-low temperature direct bonding process to form a bonded metal structure comprising the first metal feature and the second metal feature; and annealing the bonded metal structure, annealing the bonded metal structure comprising subjecting the bonded metal structure to a post-bonding thermal budget less than the total pre-bonding annealing thermal budget.

Embodiment 21

The method of Embodiment 20, further comprising using a surface assisted bonding process to directly bond the first metal feature to the second metal feature.

Embodiment 22

The method of Embodiment 20 or 21, wherein bonding the first metal feature to the second metal feature comprises abutting a bonding surface of the first metal feature directly against a bonding surface of the second metal feature to bond the first metal feature to the second metal feature at about room temperature.

Embodiment 23

The method of any one of Embodiments 20 through 22, wherein subjecting the first metal feature to a total pre-bonding annealing thermal budget comprises subjecting the first metal feature to a pre-bonding average annealing temperature over a pre-bonding annealing time period, and wherein subjecting the bonded metal structure to the post-bonding thermal budget comprises subjecting the bonded metal structure to a post-bonding average annealing temperature over a post-bonding annealing time period.

Embodiment 24

The method of Embodiment 23, wherein the pre-bonding average annealing temperature is higher than the post-bonding average annealing temperature.

Embodiment 25

The method of Embodiment 23, wherein the pre-bonding annealing time period is longer than the post-bonding annealing time period.

Embodiment 26

The method of Embodiment 23, wherein the pre-bonding average annealing temperature is higher than the post-bonding average annealing temperature, and wherein the pre-bonding annealing time period is longer than the post-bonding annealing time period.

Embodiment 27

The method of any one of Embodiments 20 through 26, further comprising forming the first metal feature to comprise copper or a copper alloy.

Embodiment 28

The method of any one of Embodiments 20 through 27, further comprising forming the first metal feature on the first semiconductor structure, forming the first metal feature comprising depositing metal over the first semiconductor structure in an electroless deposition process.

Embodiment 29

The method of any one of Embodiments 20 through 28, wherein annealing the first metal feature on the first semiconductor structure by subjecting the first metal feature to a total pre-bonding annealing thermal budget comprises: depositing metal over the first semiconductor structure to form at least a portion of the first metal feature; subjecting the metal deposited over the first semiconductor structure to a first thermal budget and annealing the metal deposited over the first semiconductor structure in a first annealing process; removing a portion of the metal deposited over the first semiconductor structure after subjecting the metal to the first thermal budget; and subjecting a remaining portion of the metal deposited over the first semiconductor structure to a second thermal budget and annealing the remaining portion of the metal deposited over the first semiconductor structure in a second annealing process.

Embodiment 30

A method of bonding a first semiconductor structure to a second semiconductor structure, comprising: annealing a first metal feature on a first semiconductor structure, annealing the first metal feature comprising subjecting the first metal feature to a pre-bonding thermal budget and causing recrystallization of at least some grains within the first metal feature, the recrystallization of grains within the first metal feature resulting in an alteration of an orientation of grains within the first metal feature; directly bonding the first metal feature to a second metal feature of a second semiconductor structure in an ultra-low temperature direct bonding process to form a bonded metal structure comprising the first metal feature and the second metal feature; and annealing the bonded metal structure, annealing the bonded metal structure comprising subjecting the bonded metal structure to a post-bonding thermal budget less than the pre-bonding thermal budget.

Embodiment 31

The method of Embodiment 30, further comprising forming the first metal feature to comprise copper or a copper alloy.

Embodiment 32

The method of Embodiment 30 or 31, wherein the recrystallization of grains within the first metal feature further results in a change in at least one of an electrical property of the first metal feature and a physical property of the first metal feature.

Embodiment 33

The method of Embodiment 32, wherein the recrystallization of grains within the first metal feature results in a decrease in electrical resistance in at least one direction within the first metal feature.

Embodiment 34

A bonded semiconductor structure formed in accordance with a method as recited in any of Embodiments 1 through 33.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternate useful combinations of the elements described, will become apparent to those skilled in the art from the description. In other words, one or more features of one example embodiment described herein may be combined with one or more features of another example embodiment described herein to provide additional embodiments of the disclosure. Such modifications and embodiments are also intended to fall within the scope of the appended claims.

What is claimed is:

1. A method of directly bonding a first semiconductor structure to a second semiconductor structure, comprising:
    depositing metal over a first semiconductor structure;
    subjecting the metal deposited over the first semiconductor structure to a first thermal budget and annealing the metal deposited over the first semiconductor structure in a first annealing process by subjecting the metal deposited over the first semiconductor structure to a first average annealing temperature over a first annealing time period;
    removing a portion of the metal deposited over the first semiconductor structure after subjecting the metal to the first thermal budget;
    subjecting a remaining portion of the metal deposited over the first semiconductor structure to a second thermal budget by subjecting the remaining portion of the metal to a second average annealing temperature over a second annealing time period and annealing the remaining portion of the metal deposited over the first semiconductor structure in a second annealing process;
    directly bonding at least one metal feature of the first semiconductor structure comprising the remaining portion of the metal deposited over the first semiconductor structure to at least one metal feature of a second semiconductor structure to form a bonded metal structure comprising the at least one metal feature of the first semiconductor structure and the at least one metal feature of the second semiconductor structure; and
    subjecting the bonded metal structure to a third thermal budget by subjecting the bonded metal structure to a third average annealing temperature over a third annealing time period and annealing the bonded metal structure in a third annealing process, the third thermal budget being less than the second thermal budget.

2. The method of claim 1, further comprising selecting the second average annealing temperature to be higher than the third average annealing temperature.

3. The method of claim 2, further comprising selecting the first average annealing temperature to be higher than the third average annealing temperature.

4. The method of claim 1, further comprising selecting the second annealing time period to be longer than the third annealing time period.

5. The method of claim 4, further comprising selecting the first annealing time period to be longer than the third annealing time period.

6. The method of claim 1, further comprising selecting the second average annealing temperature to be higher than the third average annealing temperature, and selecting the second annealing time period to be longer than the third annealing time period.

7. The method of claim 1, further comprising individually selecting each of the first average annealing temperature, the second average annealing temperature, and the third average annealing temperature to be about four hundred degrees Celsius (400° C.) or less.

8. The method of claim 7, further comprising individually selecting each of the first annealing time period, the second annealing time period, and the third annealing time period to be about two hours (2 hr.) or less.

9. The method of claim 1, wherein depositing metal over the first semiconductor structure comprises depositing metal over the first semiconductor structure using an electroless plating process.

10. The method of claim 1, wherein depositing metal over the first semiconductor structure comprises depositing metal over the first semiconductor structure using a chemical vapor deposition process.

11. The method of claim 1, wherein depositing metal over the first semiconductor structure comprises depositing metal over the first semiconductor structure in a deposition chamber, and wherein subjecting the metal deposited over the first semiconductor structure to the first thermal budget and annealing the metal deposited over the first semiconductor structure in the first annealing process comprises annealing the metal deposited over the first semiconductor structure in situ within the deposition chamber.

12. The method of claim 1, wherein removing a portion of the metal deposited over the first semiconductor structure comprises subjecting the first semiconductor structure to a chemical-mechanical polishing process.

13. The method of claim 1, further comprising selecting the metal deposited over the first semiconductor structure to comprise copper or a copper alloy.

14. The method of claim 1, further comprising:
    forming a bonding surface of the at least one metal feature of the first semiconductor structure to have a first size; and
    forming a bonding surface of the at least one metal feature of the second semiconductor structure to have a second size different from the first size of the bonding surface of the at least one metal feature of the first semiconductor structure.

15. The method of claim 1, further comprising:
    forming a bonding surface of the at least one metal feature of the first semiconductor structure to have a first shape; and
    forming a bonding surface of the at least one metal feature of the second semiconductor structure to have a second shape different from the first shape of the bonding surface of the at least one metal feature of the first semiconductor structure.

16. The method of claim 1, wherein directly bonding the at least one metal feature of the first semiconductor structure to the at least one metal feature of the second semiconductor structure comprises an ultra-low temperature direct bonding process.

17. The method of claim 16, wherein directly bonding the at least one metal feature of the first semiconductor structure to the at least one metal feature of the second semiconductor structure comprises a surface assisted bonding process.

18. The method of claim 16, wherein directly bonding the at least one metal feature of the first semiconductor structure to the at least one metal feature of the second semiconductor structure comprises abutting a first bonding surface of the at least one metal feature of the first semiconductor structure directly against a second bonding surface of the at least one metal feature of the second semiconductor structure in an environment at about room temperature.

* * * * *

UNITED STATES PATENT AND TRADEMARK OFFICE
CERTIFICATE OF CORRECTION

| | | |
|---|---|---|
| PATENT NO. | : 8,501,537 B2 | Page 1 of 1 |
| APPLICATION NO. | : 13/076840 | |
| DATED | : August 6, 2013 | |
| INVENTOR(S) | : Mariam Sadaka et al. | |

It is certified that error appears in the above-identified patent and that said Letters Patent is hereby corrected as shown below:

In the specification:
    COLUMN 11,   LINE 11,   change "budge" to --budget--

Signed and Sealed this
Twenty-second Day of December, 2015

Michelle K. Lee
*Director of the United States Patent and Trademark Office*